(12) United States Patent
Chiang et al.

(10) Patent No.: US 12,723,669 B2
(45) Date of Patent: Sep. 1, 2026

(54) CHECK VALVE MODULE AND CHASSIS HAVING THE SAME

(71) Applicant: Fulian Precision Electronics (Tianjin) Co., LTD., Tianjin (CN)

(72) Inventors: Wen-Ling Chiang, New Taipei (TW); Chang-Ju Wu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 87 days.

(21) Appl. No.: 18/952,972

(22) Filed: Nov. 19, 2024

(65) Prior Publication Data

US 2026/0043488 A1 Feb. 12, 2026

(30) Foreign Application Priority Data

Aug. 7, 2024 (CN) ........................ 202411079535.2

(51) Int. Cl.
*F16K 15/16* (2006.01)
*F16K 15/14* (2006.01)
*H05K 7/20* (2006.01)

(52) U.S. Cl.
CPC .......... *F16K 15/16* (2013.01); *F16K 15/1401* (2021.08); *H05K 7/20145* (2013.01); *H05K 7/20727* (2013.01)

(58) Field of Classification Search
CPC . F16K 15/16; F16K 15/1401; H05K 7/20145; H05K 7/20727; H05K 7/20172; H05K 7/20181
See application file for complete search history.

(56) References Cited

U.S. PATENT DOCUMENTS 3,307,819 A * 3/1967 Cocito .................... B66C 1/025 269/21
6,174,232 B1 * 1/2001 Stoll .................. H05K 7/20172 361/695
6,668,849 B2 * 12/2003 Onstenk .............. F16K 15/1471 137/533.27
8,057,161 B2 * 11/2011 Seidler .................. F04D 29/703 415/26
8,377,115 B2 * 2/2013 Thompson ............ A61F 2/2427 623/2.14
8,668,435 B2 * 3/2014 Weisser .................. F04D 25/14 415/26
9,639,093 B2 * 5/2017 Morgan ............. G05D 16/0663
2017/0218978 A1 * 8/2017 Amin-Shahidi ...... F04D 29/522
2019/0107017 A1 * 4/2019 Brinker ................... F16K 15/16
2019/0120098 A1 * 4/2019 Schiele ................... F16K 17/02
2020/0011215 A1 * 1/2020 Thomas ................ F01L 1/3442

* cited by examiner

*Primary Examiner* — Patrick C Williams
(74) *Attorney, Agent, or Firm* — ScienBiziP, P.C.

(57) ABSTRACT

A check valve module designed for installation on a fan module. The module includes a base with a connecting shaft and a connecting member, a baffle with first, second, and third portions featuring an opening and an elastically connected shielding member, a first rotating member connected to the connecting member and the first portion of the baffle, and a second rotating member connected to the connecting shaft and the second portion. The shielding member can be blown open by fan module airflow, causing the baffle to rotate and the second portion to move along a first direction, thus opening a passage connecting the baffle portions to the outside.

18 Claims, 8 Drawing Sheets

CHECK VALVE MODULE AND CHASSIS HAVING THE SAME

FIELD

The subject matter herein generally relates to the field of chassis, particularly to a check valve module and a chassis having the check valve module.

BACKGROUND

Servers are housed within chassis. The sever may have a fan, and the fan can expel heat from the interior to the exterior of the server. When the fan breaks down, reverse airflow can occur, leading to turbulent cooling paths and reduced cooling efficiency inside the chassis.

BRIEF DESCRIPTION OF THE DRAWINGS

Implementations of the present technology will now be described, by way of example only, with reference to the attached figures, wherein.

DETAILED DESCRIPTION

Figure 1:
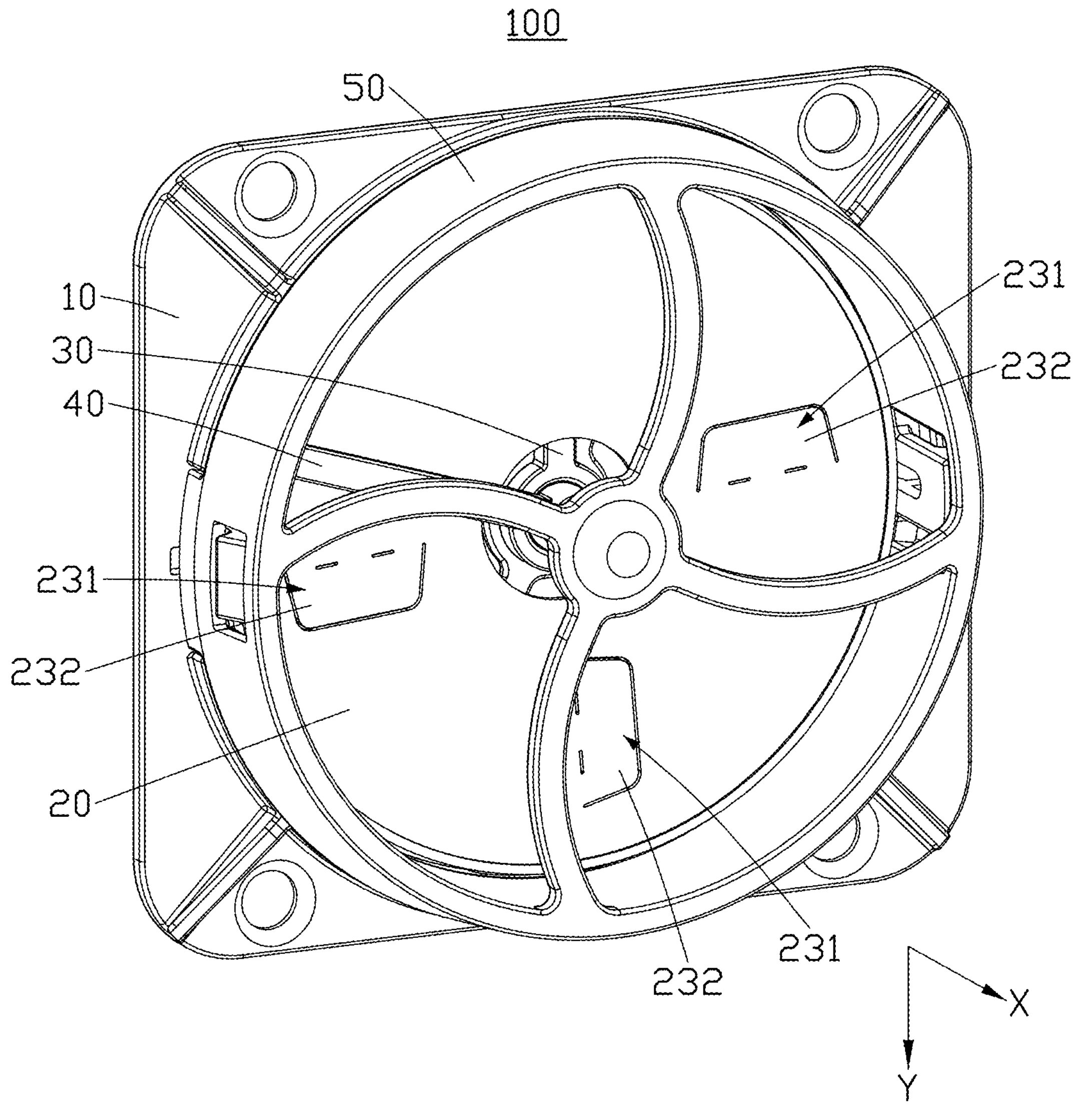
FIG. 1 is a diagrammatic view of a check valve module according to one embodiment of the present disclosure.
Figure 2:
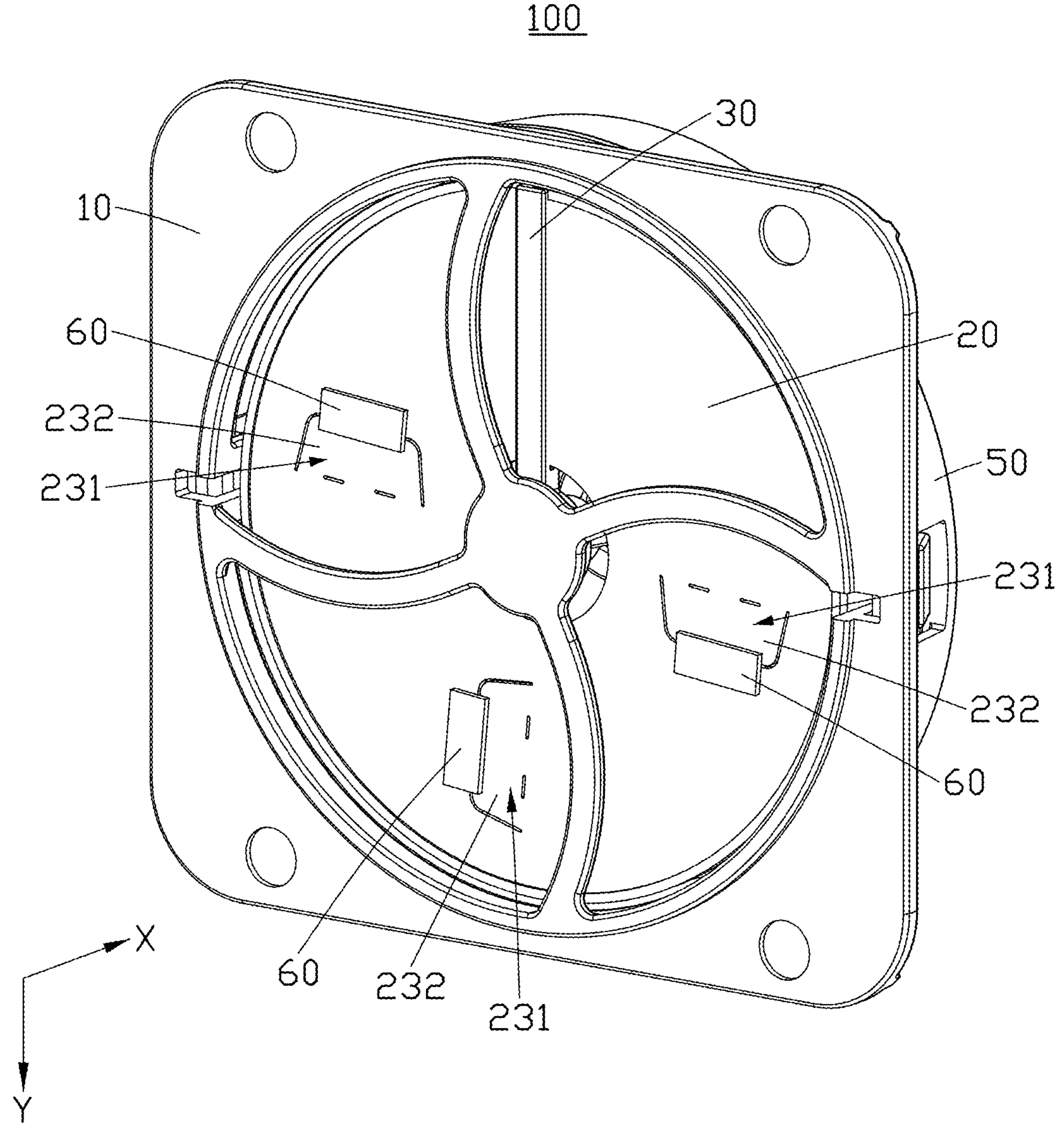
FIG. 2 is similar to FIG. 1, but showing the check valve module from another angle.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain portions have been exaggerated to better illustrate details and features of the present disclosure.

Referring to FIGS. 1 to 4, a check valve module 100 is provided according to an embodiment of the present application. The check valve module 100 may be installed on a fan module 210 shown in FIG. 8. The check valve module 100 includes a base 10. The base 10 includes a connecting shaft 11 and a connecting member 12 fixed to the connecting shaft 11. In one embodiment, the connecting member 12 includes a bearing. In other embodiments, the connecting member 12 may selected from other mechanical connection components such as a bush, a sleeve with low-friction coating, or a flexible coupling.

In one embodiment, the check valve module 100 includes a baffle 20. The baffle 20 includes a first portion 21 and a second portion 22 located at the head and tail areas of the baffle 20, respectively, and a third portion 23 connected to the first portion 21 and the second portion 22. The first portion 21 and the second portion 22 overlap with each other along a first direction X. The baffle 20 is elastically deformed along the first direction X. In one embodiment, the baffle 20 is helical in shape. In other embodiments, the baffle is cylindrical in shape.

The check valve module 100 includes a first rotating member 30 rotatably connected to the connecting member 12. The first rotating member 30 is connected to the first portion 21.

The check valve module 100 further includes a second rotating member 40 rotatably connected to the connecting shaft 11 and movably arranged along the first direction X. The second rotating member 40 is connected to the second portion 22.

Figure 6:
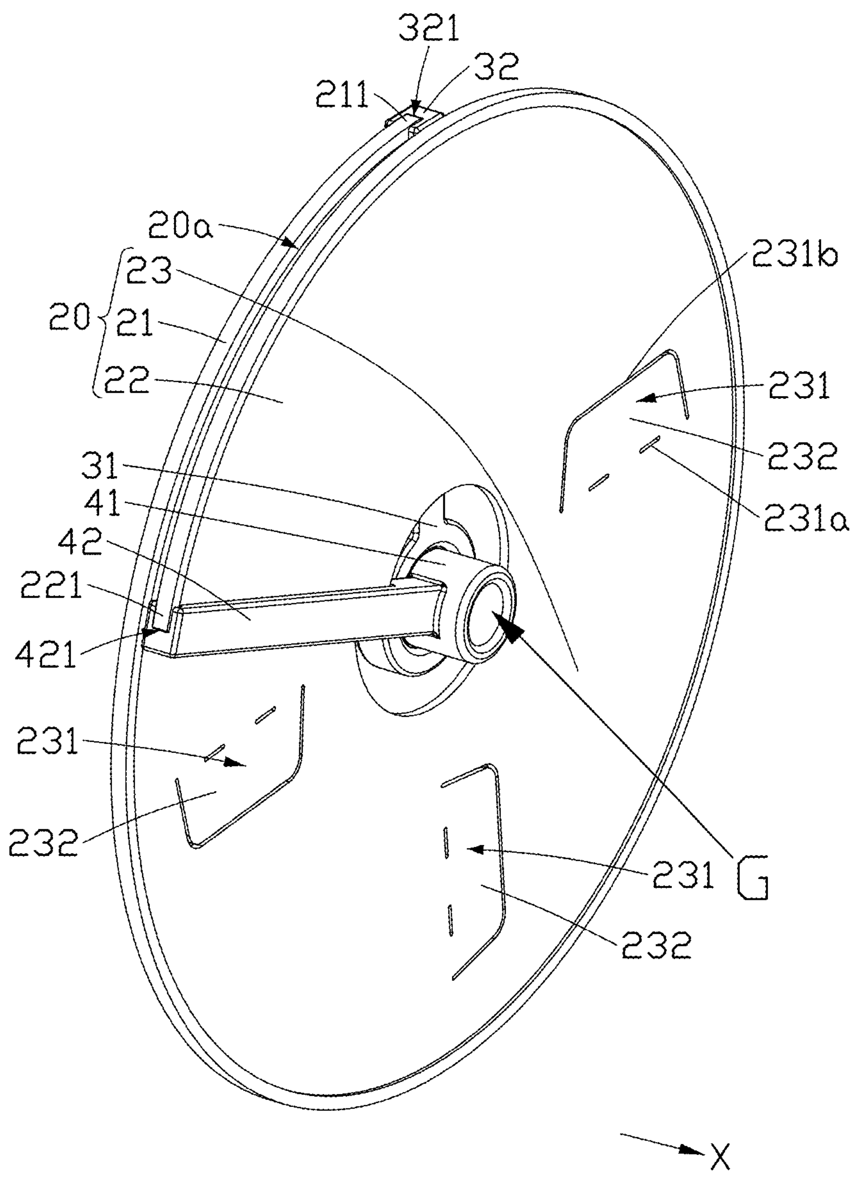
FIG. 6 is a diagrammatic view showing a baffle, a first rotating member, and a second rotating member of the check valve module in FIG. 1.
Figure 7:
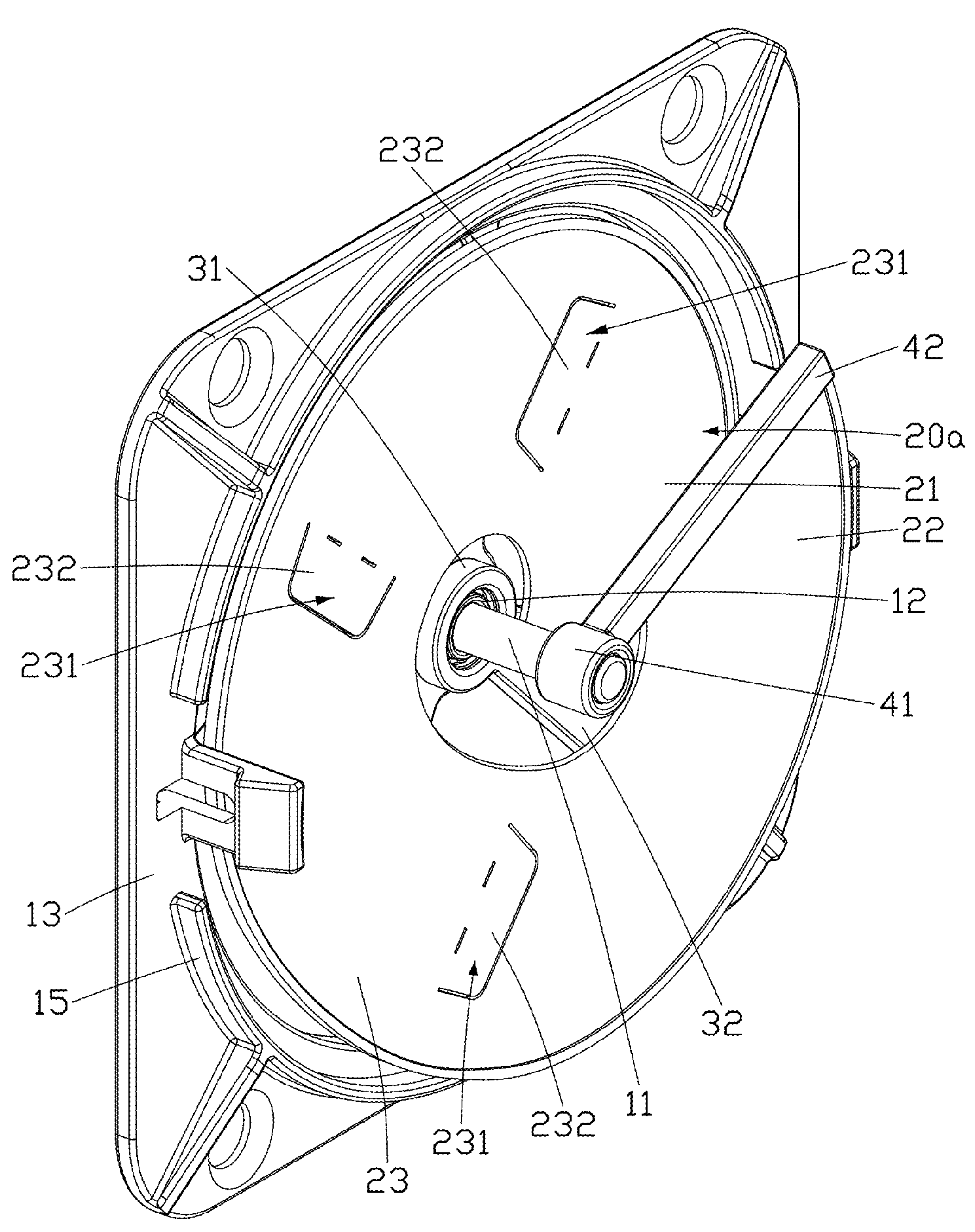
FIG. 7 is a diagrammatic view showing the baffle in FIG. 6 in an open state.

The third portion 23 includes an opening 231 and a shielding member 232 elastically connected to an inner rim of the opening 231. The shielding member 232 is configured to elastically deform when driven by an airflow force from the fan module 210, thereby exposing the opening 231. Thus, the baffle 20 rotates and the second portion 22 moves along the first direction X under the airflow force from the fan module 210. The movement of the second portion 22 opens a passage 20*a* (shown in FIG. 6) between the first portion 21 and the second portion 22, and the passage 20*a* communicates with the exterior environment.

By utilizing the airflow force to open the opening 231, the baffle 20 rotates and the second portion 22 moves along the first direction X under the airflow force, thereby increasing a distance between the first portion 21 and the second portion 22. Then, the airflow is expelled through the passage 20*a* between the first and second portions. When the fan module 210 does not output airflow, since the second portion 22 is elastic, the second portion 22 moves in the opposite direction closer to the first portion 21 to close the passage 20*a*. This reduces reverse airflow and turbulence, thereby improving cooling efficiency within the chassis and reducing the ingress of external dust. Thus, the check valve module 100 reduces the occurrence of reverse airflow, especially when the fan module 210 breaks down.

In one embodiment, the second portion 22 and the third portion 23 are elastic along the first direction X and telescopically arranged along the first direction X. In one embodiment, all of the first portion 21, second portion 22, and third portion 23 are elastic along the first direction X and telescopically arranged along the first direction X.

Figure 3:
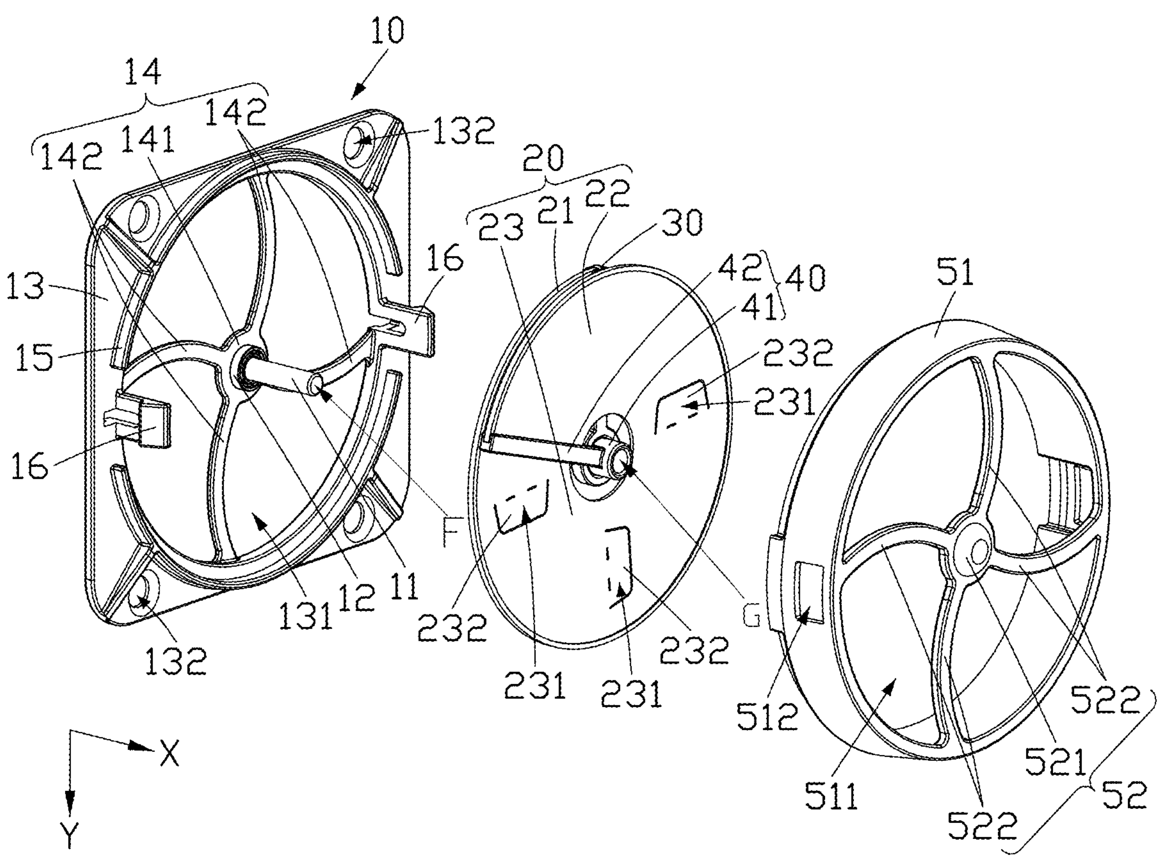
FIG. 3 is an exploded view of the check valve module in FIG. 1.
Figure 4:
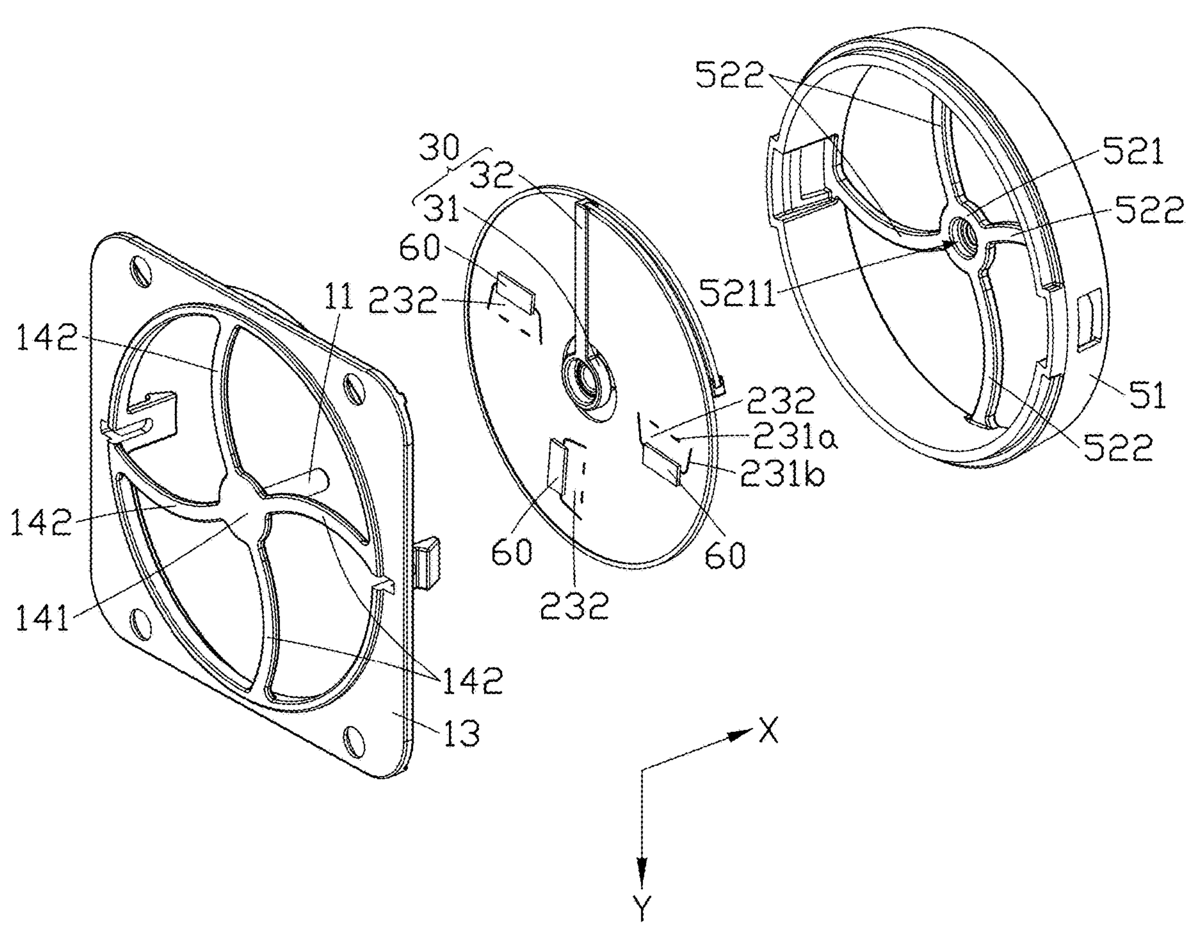
FIG. 4 is similar to FIG. 3, but showing the check valve module from another angle.

Referring to FIGS. 3 and 4, the base 10 includes a first main body 13. The first main body 13 defines a first through-hole 131. The first main body 13 is positioned on one side of the base 10 close to the fan module 210, allowing the airflow to blow through the first through-hole 131 towards the baffle 20. In other embodiments, multiple connecting holes 132 may be defined on the first main body 13. Fasteners, such as screws, may be used to connect the check valve module 100 to the fan module 210.

The base 10 includes a first fixing portion 14 connected to the first main body 13. The first fixing portion 14 is arranged inside the first through-hole 131. The connecting shaft 11 is fixed to the first fixing portion 14.

The first fixing portion 14 includes a first fixing member 141 and multiple first supporting members 142. Each first supporting member 142 includes one end fixed to the first main body 13 and another end fixed to the first fixing member 141. The connecting shaft 11 is fixed to the first fixing member 141.

In one embodiment, the first fixing member 141, the connecting shaft 11, and first through-hole 131 have the same center.

Figure 5:
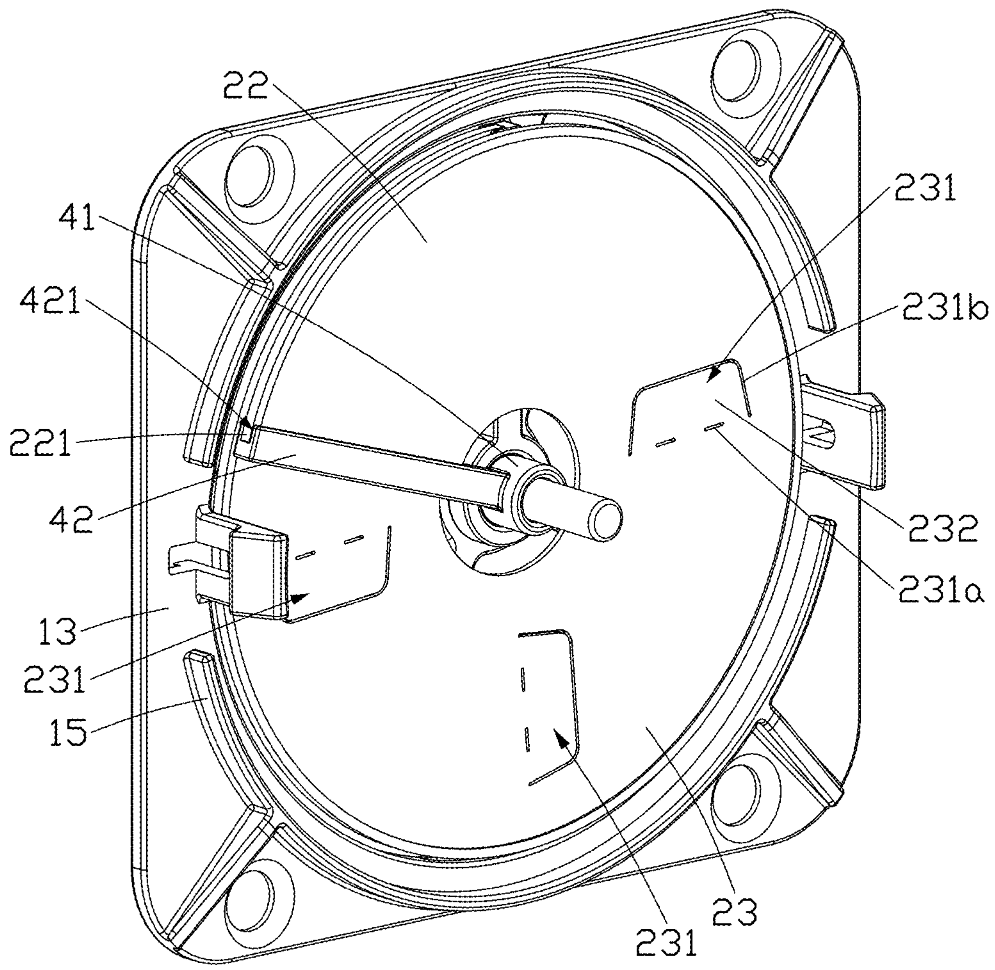
FIG. 5 is a diagrammatic view of portions of the check valve module in FIG. 1.

Referring to FIG. 5, the base 10 further includes an extension wall 15 protruding from the first main body 13 towards the baffle 20 along the first direction X. Along a second direction Y, a portion of the projection of the baffle 20 is within the projection of the extension wall 15. The extension wall 15 guides the airflow to flow substantially along the first direction X towards the baffle 20, facilitating the opening of the opening 231 and the rotation of the baffle 20, thereby forming the passage 20*a* connecting the first portion 21 and the second portion 22 to the outside.

When the passage 20*a* is closed, the projection of the baffle 20 along the second direction Y is within the projection of the extension wall 15.

When the passage 20*a* is open, a portion of the projection of the baffle 20 along the second direction Y is within the projection of the extension wall 15.

Referring to FIGS. 3 and 4, the check valve module 100 further includes a cover 50 connected to the base 10. The cover 50 includes a second main body 51 with a second through-hole 511. The airflow from the passage 20*a* blows to the exterior environment through the second through-hole 511. The cover 50 guides the airflow to flow along the first direction X, thereby reducing the entry of dust.

The base 10 further includes a latching member 16, and the second main body 51 defines a connecting opening 512. When the cover 50 is installed on the base 10, the latching member 16 is received within the connecting opening 512. In other embodiments, the second main body 51 is glued to the first main body 13.

The cover 50 further includes a second fixing portion 52 connect ed to the second main body 51. The second fixing portion 52 is arranged inside the second through-hole 511. The connecting shaft 11 is connected to the second fixing portion 52.

The second fixing portion 52 includes a second fixing member 521 and multiple second supporting members 522. Each second supporting member 522 has one end fixed to the second main body 51 and another end fixed to the second fixing member 521. The connecting shaft 11 is connected to the second fixing member 521.

One side of the second fixing member 521 facing the base 10 defines a groove 5211 where the connecting shaft 11 is positioned. This arrangement stabilizes the baffle 20 during rotation, reducing offset of the rotation center of the baffle 20 and preventing the baffle 20 from contacting the cover 50. The above offset of the rotation center, which could hinder the opening 231 or closing of the passage 20*a*.

In one embodiment, the first fixing member 141, the connecting shaft 11, the first through-hole 131, the second fixing member 521, and the second through-hole 511 have the same center.

Referring to FIGS. 4 and 5, the check valve module 100 further includes a stopper 60 connected to one side of the third portion 23 facing the base 10. Along the first direction X, a projection of the stopper 60 overlaps with the projection of the opening 231. When the fan module 210 does not operate, the shielding member 232 elastically rebounds to close the opening 231. When the fan module 210 operates to generate the airflow towards the interior of the chassis, the stopper 60 limits the shielding member 232, thereby preventing the shielding member 232 from opening the opening 231 and reducing airflow backflow into the chassis. In other embodiments, the stopper 60 is glued to the side of the third portion 23 facing the base 10.

The opening 231 includes a first edge 231*a* and a second edge 231*b* opposite to each other. The shielding member 232 is connected to the first edge 231*a*. Along the first direction X, a projection of the stopper 60 overlaps with the projection of the second edge 231*b*, thereby limiting the position of the shielding member 232.

A portion of the shielding member 232 is connected to the first edge 231*a*, thereby facilitating the airflow to blow the shielding member 232 to open the opening 231. The opening 231 may have a trapezoidal structure, and the first edge 231*a* is located at the top or bottom side of the opening 231, thereby reducing space occupation along the first direction X when the shielding member 232 opens the opening 231 and thus decreasing the thickness of the check valve module 100.

Along the first direction X, a thickness d of the check valve module 100 satisfies 12 mm≤d≤15 mm. Optionally, d may be 12 mm, 12.5 mm, 13 mm, 13.5 mm, 14 mm, 14.5 mm, or 15 mm.

The third portion 23 includes three openings 231. Extension lines of the first edge 231*a* of each opening 231 pass through a center of the baffle 20, thereby facilitating the airflow to drive the baffle 20 to rotate.

Referring to FIGS. 3, 4, 6, and 7, a geometric center G of the baffle 20 is coincided with a center of gravity of the baffle 20. The geometric center G of the baffle 20 is coincided with a geometric center F of the connecting shaft 11, thereby facilitating stable rotation and the opening or closing of the passage 20*a*.

The first rotating member 30 includes a first rotating portion 31 and a first connecting portion 32. The first rotating portion 31 is rotatably connected to the connecting member 12. The first connecting portion 32 is connected to the first rotating portion 31 and the first portion 21. Along the first direction X, the first connecting portion 32 is connected to the side of the first portion 21 away from the second portion 22.

The first portion 21 includes a first end 211 located at the end away from the third portion 23. The first connecting portion 32 has a first recess 321, and the first end 211 is positioned within the first recess 321, thereby stabilizing the rotation of the baffle 20 and reducing the offset of the rotation center of the baffle 20. The first end 211 may be received within the first recess 321 by latching or gluing.

The second rotating member 40 includes a second rotating portion 41 and a second connecting portion 42. The second rotating portion 41 is sleeved on the connecting shaft 11. The second connecting portion 42 is connected to the second rotating portion 41 and the second end 221 of the second portion 22.

Along the first direction X, the second connecting portion 42 is connected to the side of the second portion 22 away from the first portion 21.

The second portion 22 includes a second end 221 located at the end away from the third portion 23. The second connecting portion 42 has a second recess 421, and the second end 221 is positioned within the second recess 421, thereby stabilizing the rotation of the baffle 20 and reducing the offset of the rotation center of the baffle 20. The second end 221 may be received within the second recess 421 by latching or gluing.

Along the first direction X, portions of the first connecting portion 32 and the second connecting portion 42 may be located between the first portion 21 and the second portion 22. When the baffle 20 retracts, the second connecting portion 42 can close the passage 20*a*, reducing airflow backflow.

The connecting shaft 11, the connecting member 12, the first rotating member 30, and the second rotating member 40 have the same center.

Figure 8:
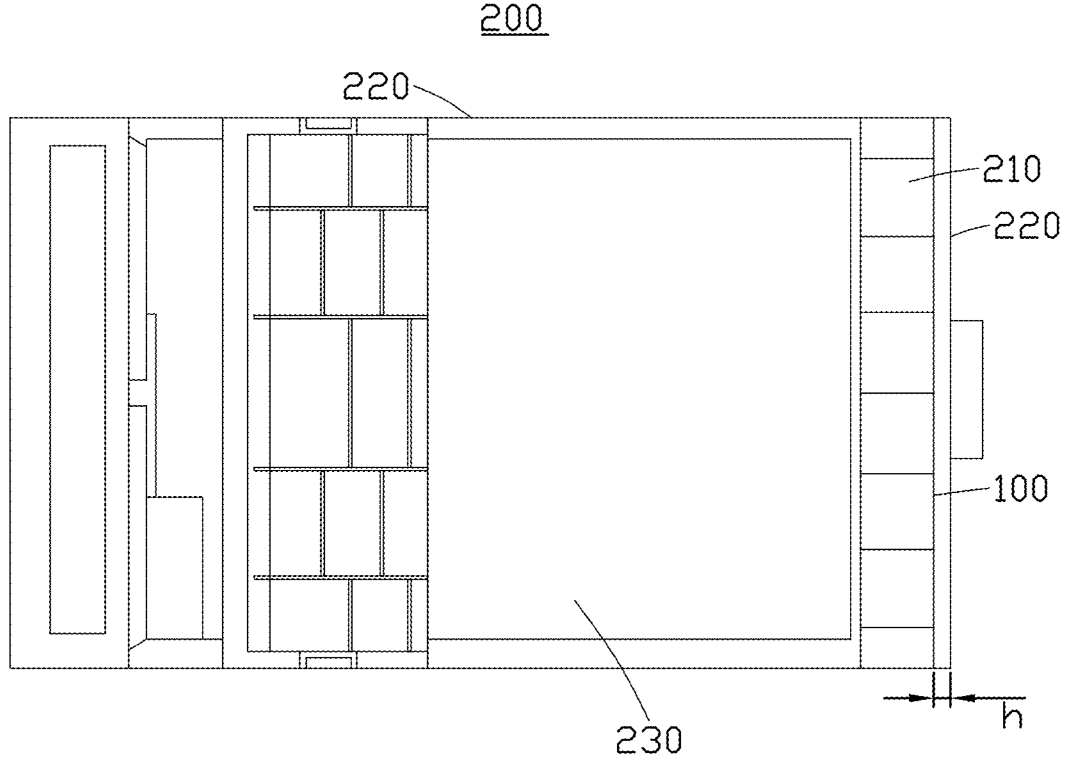
FIG. 8 is a diagrammatic view of a chassis according to one embodiment of the present application.

Referring to FIG. 8, a chassis 200 is provided according to an embodiment of the present disclosure. The chassis 200 includes a fan module 210, a chassis body 220, a processing module 230, and the check valve module 100 as described in any of the embodiments mentioned above. The processing module 230 and the fan module 210 are arranged along the first direction X within the chassis body 220. The check valve module 100 is positioned between the fan module 210 and the chassis body 220 along the first direction X. The processing module 230 includes a processor, a memory unit, and various interface circuits. The processor is responsible for executing instructions and performing computational tasks. The memory unit stores data and programs for the processor to access. The interface circuits enable communication with other components within the chassis 200 and external devices.

Along the first direction X, the distance h between the fan module 210 and the chassis body 220 satisfies 12 mm≤h≤15 mm. Optionally, h may be 12 mm, 12.5 mm, 13 mm, 13.5 mm, 14 mm, 14.5 mm, or 15 mm.

In one embodiment, h is equaled to the thickness d of the check valve module 100, reducing the space occupied by the chassis 200.

Even though information and advantages of the present embodiments have been set forth in the foregoing description, together with details of the structures and functions of the present embodiments, the disclosure is illustrative only. Changes may be made in detail, especially in matters of shape, size, and arrangement of portion within the principles of the present exemplary embodiments, to the full extent indicated by the plain meaning of the terms in which the appended claims are expressed.

What is claimed is:

1. A check valve module configured to be installed on a fan module, the check valve module comprising:

a base;

a baffle;

a first rotating member; and a second rotating member, wherein:

the base comprises a connecting shaft and a connecting member fixed to the connecting shaft;

the baffle comprises a first portion, a second portion, and a third portion connected to the first portion and the second portion, the first portion and the second portion overlap with each other along a first direction, the first portion and the second portion cooperatively define a passage therebetween, the passage communicates with an exterior environment to the fan module, the third portion comprises an opening and a shielding member elastically connected to an inner rim of the opening, the baffle is configured to be elastically deformed along the first direction;

the first rotating member is rotatably connected to the connecting member and connected to the first portion;

the second rotating member is rotatably connected to the connecting shaft and movably arranged along the first direction, the second rotating member is connected to the second portion; and the shielding member is positioned in an airflow path of the fan module so that the shielding member is driven by airflows when the fan module is switched on to expose the opening by rotating the baffle and moving the second portion along the first direction by the airflows.

2. The check valve module of claim 1, wherein the first rotating member comprises a first rotating portion and a first connecting portion, the first rotating portion is rotatably connected to the connecting member; the first connecting portion is connected to the first rotating portion and the first portion.

3. The check valve module of claim 2, wherein the first portion comprises a first end connected to an end of the first portion away from the third portion, the first connecting portion defines a first recess, and the first end is disposed within the first recess.

4. The check valve module of claim 2, wherein the second rotating member comprises a second rotating portion and a second connecting portion, the second rotating portion is sleeved on the connecting shaft, the second portion comprises a second end connected to an end of the second portion away from the third portion, and the second connecting portion is connected to the second end.

5. The check valve module of claim 4, wherein along the first direction, a portion of the first connecting portion is arranged between the first portion and the second portion; and/or, along the first direction, a portion of the second connecting portion is arranged between the first portion and the second portion.

6. The check valve module of claim 1, further comprising a stopper connected to a side of the third portion facing the base, wherein along the first direction, a projection of the stopper overlaps with a projection of the opening.

7. The check valve module of claim 6, wherein the opening comprises a first edge and a second edge opposite to each other, the shielding member is connected to the first edge, and along the first direction, a projection of the stopper overlaps with a projection of the second edge.

8. The check valve module of claim 6, further comprising a cover connected to the base, wherein the base further comprises a first fixing portion, the cover comprises a second fixing portion, the connecting shaft is connected to the first fixing portion and the second fixing portion, and each of the first rotating member, the baffle, and the second rotating member is located between the first fixing portion and the second fixing portion.

9. The check valve module of claim 1, wherein a geometric center of the baffle is coincided with a center of gravity of the baffle, and the geometric center of the baffle is coincided with a geometric center of the connecting shaft.

10. A chassis comprising:

a chassis body;

a processing module;

a fan module, and a check valve module comprising:

a base;

a baffle;

a first rotating member; and a second rotating member, wherein:

the base comprises a connecting shaft and a connecting member fixed to the connecting shaft;

the baffle comprises a first portion, a second portion, and a third portion connected to the first portion and the second portion, the first portion and the second portion overlap with each other along a first direction, the first portion and the second portion cooperatively define a passage therebetween, the passage communicates with an exterior environment to the chassis, the third portion comprises an opening and a shielding member elastically connected to an inner rim of the opening, the baffle is configured to be elastically deformed along the first direction;

the first rotating member is rotatably connected to the connecting member and connected to the first portion;

the second rotating member is rotatably connected to the connecting shaft and movably arranged along the first direction, the second rotating member is connected to the second portion;

the shielding member is positioned in an airflow path of the fan module so that the shielding member is driven by airflows when the fan module is switched on to expose the opening by rotating the baffle and moving the second portion along the first direction by the airflows;

the processing module and the fan module are arranged along the first direction within the chassis body, and along the first direction, the check valve module is provided between the fan module and the chassis body.

11. The chassis of claim 10, wherein the first rotating member comprises a first rotating portion and a first connecting portion, the first rotating portion is rotatably connected to the connecting member; the first connecting portion is connected to the first rotating portion and the first portion.

12. The chassis of claim 11, wherein the first portion comprises a first end connected to an end of the first portion away from the third portion, the first connecting portion defines a first recess, and the first end is disposed within the first recess.

13. The chassis of claim 11, wherein the second rotating member comprises a second rotating portion and a second connecting portion, the second rotating portion is sleeved on the connecting shaft, the second portion comprises a second end connected to an end of the second portion away from the third portion, and the second connecting portion is connected to the second end.

14. The chassis of claim 13, wherein along the first direction, a portion of the first connecting portion is arranged between the first portion and the second portion; and/or, along the first direction, a portion of the second connecting portion is arranged between the first portion and the second portion.

15. The chassis of claim 10, wherein the check valve module further comprises a stopper connected to a side of the third portion facing the base, along the first direction, a projection of the stopper overlaps with a projection of the opening.

16. The chassis of claim 15, wherein the opening comprises a first edge and a second edge opposite to each other, the shielding member is connected to the first edge, and along the first direction, a projection of the stopper overlaps with a projection of the second edge.

17. The chassis of claim 15, wherein the check valve module further comprises a cover connected to the base, the base further comprises a first fixing portion, the cover comprises a second fixing portion, the connecting shaft is connected to the first fixing portion and the second fixing portion, and each of the first rotating member, the baffle, and the second rotating member is located between the first fixing portion and the second fixing portion.

18. The chassis of claim 10, wherein a geometric center of the baffle is coincide d with a center of gravity of the baffle, and the geometric center of the baffle is coincided with a geometric center of the connecting shaft.

* * * * *